United States Patent [19]

Schellhorn et al.

[11] Patent Number: 4,907,044
[45] Date of Patent: Mar. 6, 1990

[54] OPTICAL EMISSION DEVICE

[75] Inventors: Franz Schellhorn; Guenter Waitl, both of Regensburg, Fed. Rep. of Germany

[73] Assignee: Siemens Aktiengesellschaft, Berlin and Munich, Fed. Rep. of Germany

[21] Appl. No.: 380,698

[22] Filed: Jul. 14, 1989

Related U.S. Application Data

[63] Continuation of Ser. No. 289,075, Dec. 22, 1988, abandoned, which is a continuation of Ser. No. 144,892, Jan. 13, 1988, abandoned.

[30] Foreign Application Priority Data

Oct. 15, 1987 [DE] Fed. Rep. of Germany ... 8713875[U]

[51] Int. Cl.$^4$ ...................... H01L 33/00; H05B 33/02
[52] U.S. Cl. ........................................ 357/17; 357/72; 357/73; 357/74; 313/498; 313/499
[58] Field of Search ............................... 357/17, 72–74; 313/498, 499

[56] References Cited

U.S. PATENT DOCUMENTS 4,560,901 12/1985 Thillays .................................. 357/17

Primary Examiner—William L. Sikes
Assistant Examiner—Georgia Y. Epps

[57] ABSTRACT

An optical emission device with an emitter semiconductor chip and a cover intended to be suitable for backlighting areas, the device having a comparatively low structural height and low packing density. The cover has a light aperture formed using a convex and concave lens for radiating light in a solid angle of maximum size. This device can also be used in combination with an additional external reflector and diffusion screen.

12 Claims, 3 Drawing Sheets

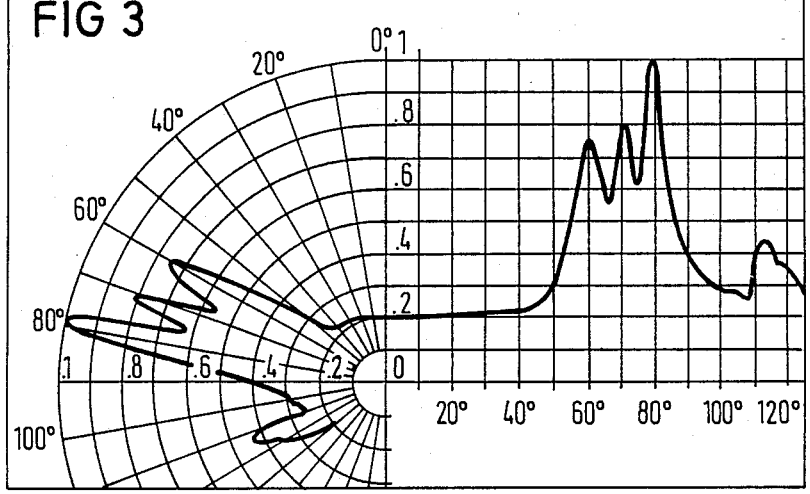
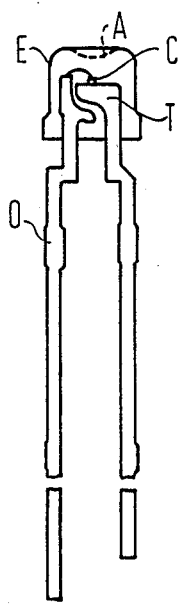
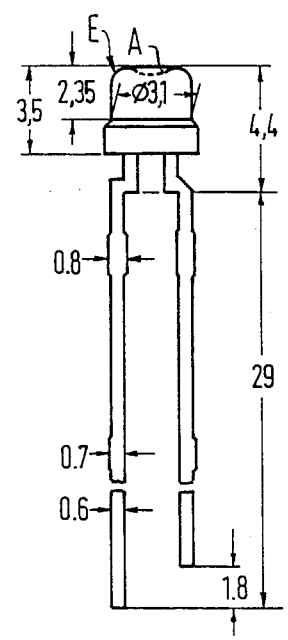
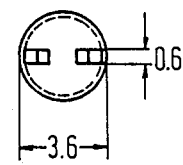
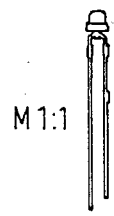

OPTICAL EMISSION DEVICE

CROSS-REFERENCE TO RELATED APPLICATION

This is a continuation of Ser. No. 07/289,075 filed Dec. 22, 1988 now abandoned.

BACKGROUND OF THE INVENTION

The invention relates to an optical emission device with a semiconductor emission chip and a cover. The aperture from which the light emerges is adapted for a desired radiation characteristic. Such optical emission devices are described, for Example, in U.S. Pat. No. 4,638,343 which issued on Jan. 20, 1987.

Special optical emission devices are required for the illumination of areas. Standard light emitting diodes (LEDs) and small incandescent light bulbs are generally designed so as to concentrate their radiation within a narrow cone in the axial direction (FIG. 1) and, therefore, the areas which can be illuminated homogeneously are narrowly limited zones. Furthermore, when using standard LEDs and light bulbs, large structural height and a high degree of packing density are required. The life of an LED is, moreover, greater by at least a factor of 100 over that of an incandescent light bulb.

As can be appreciated, there is a need for an optical emission device of the above-mentioned kind which lends itself to the function of backlighting areas, symbols and letters while being of comparatively low structural height and requiring a low packing density.

SUMMARY OF THE INVENTION

According to this invention, an improved optical emission device is provided wherein the cover has a light aperture is composed of a concave lens for radiating light into a solid angle of maximum size. Preferrably, the cover includes a convex lens and concave lens for uniform distribution of light into a solid angle of maximum size. The convex lens contacts the concave lens such that there is a smooth transition region between the lenses. It is also preferrable if the optical emission device is built as a surface mounted device (SMD) component which can include a planer chip carrier for an emitter semiconductor chip and/or an exterior reflector. The exterior reflector can also include a diffusion screen. Additionally, it is advantageous if the emitter semiconductor chip has a lambertian surface or characteristics.

In an optical emission device according to the invention, the light energy is emitted into as large a solid angle as is possible. In contrast to conventional LEDs, in which the emitter semiconductor chip is mounted in specifically shaped reflectors in the LED carrier, the optical emission device according to the invention utilizes a planer chip carrier. The optical emission device can be formed using an emitter semiconductor chip with a lambertian surface and a concave lens integrally formed over the emitter semiconductor chip on the epoxy body of the optical emission device. In this configuration, the radiation in the axial direction of the optical emission device is reduced to 20% and simultaneously distributed over a solid angle from 60 degrees to 120 degrees with a maximum of the radiation at 80 degrees. The uniform distribution of the radiation over this angle is achieved through the convex lens which forms a tangent on the concave lens.

The radiation emerging under a large angle is uniformly deflected over an exterior reflector onto the area to be illuminated. Size and shape of the reflector are developed so that the area to be illuminated is uniformly illuminated. A diffusion screen on the reflector serves to make the radiation of the optical emission device homogeneous.

An optical emission device according to the invention can also be built as an SMD (surface mounted device) component. An SMD component has additional advantages with respect to the overall height of such a component in that it can be manufactured in the form of a complete illumination unit with a height of approximately 3 millimeters.

BRIEF DESCRIPTION OF THE DRAWINGS

The preferred embodiment of the invention will be described with reference to the accompanying drawings wherein:

FIG. 3 represents the radiation characteristics of an optical emission device according to the invention;

FIGS. 4 to 6 illustrate the structure of the optical emission device accordance with the invention;

DETAILED DESCRIPTION OF THE PREFERRED EMBODIMENTS

The advantage of an optical emission device O according to the invention is more effective when this component O is used in connection with an additional external reflector R and a diffusion screen S. In the arrangement according to FIG. 2, uniformly illuminated areas are obtained for the backlighting of symbols, letters, etc.

FIG. 3 illustrates the radiation characteristic of an optical emission device O which radiates in the axial direction (0 degrees) with only 20% of the maximum value.

Figure 1:
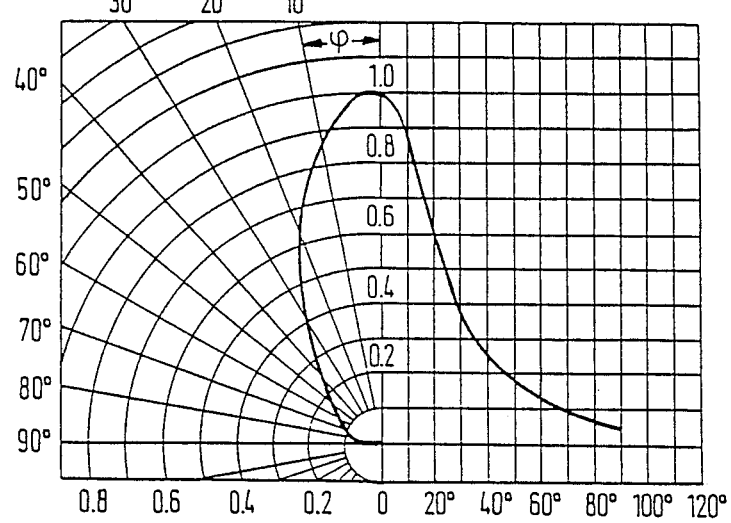
FIG. 1 represents the radiation characteristics of a conventional light emitting diode (LED)

FIG. 4 illustrates the structure of an optical emission device O with an emitter semiconductor chip C, including a cover having a concave lens A and a convex lens E which surrounds the concave lens A. Manufacturing the optical emission device O can be accomplished using substantially the same concepts used in manufacturing standard LEDs. This also applies to the manufacture of the LED chips C. Standard LEDs are structured so that the maximum radiation is concentrated in the axial direction. (See FIG. 1 at 0 degrees.) Radiation characteristics of standard LEDs, as shown in FIG. 1, are achieved by mounting the LED chip in a specifically shaped reflector and an epoxy body developed as convex lens.

In contrast to standard LEDs, an optical device emission device O is formed so that radiation in a of maximum size solid angle results (FIG. 3). In an optical emisssion device O this is achieved by using a carrier T which is not equipped with a reflector, and an epoxy body built as a concave lens A. In order to avoid creating bright zones (hot spots) in an area to be illuminated by the optical emission device, the radiation in the axial direction (forward radiation) is reduced to approximately 20% of the maximum value (FIG. 3) by utilizing the concave lens A.

FIGS. 5 and 6 illustrate one embodiment of the invention optical emission device along with dimensions in milimeters.

Figure 2:
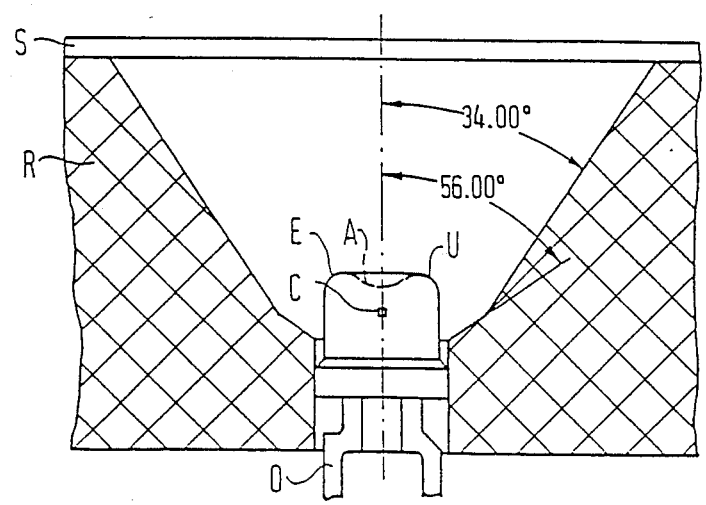
FIG. 2 represents an optical emission device according to the invention together with an external reflector and a diffusion screen.
Figure 7:
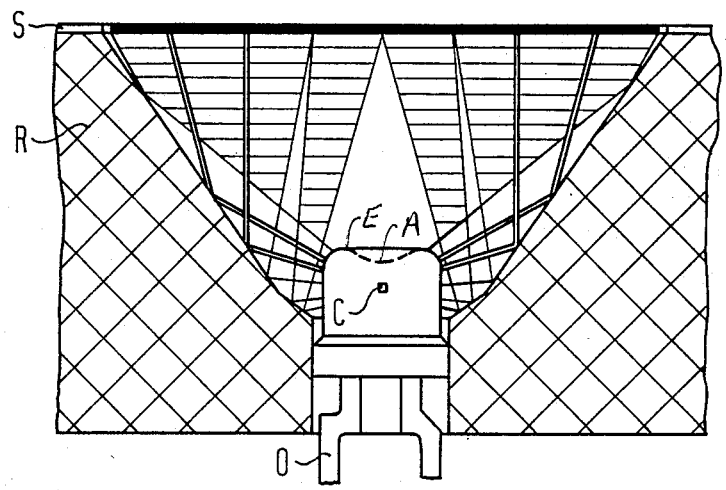
FIG. 7 shows the light distribution of the optical emission device according to the invention.

FIG. 7 illustrates the light distribution within reflector R when using an arrangement according to FIG. 2. As illustrated in FIG. 7, the diffusion screen S on the reflector R, is uniformly illuminated.

Figure 8:
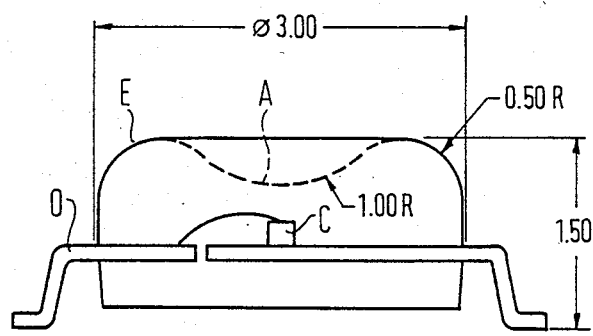
FIG. 8 is an optical emission device according to the invention built as an SMD component.

FIG. 8 illustrates an embodiment of an optical emission device O including an SMD component which can be mounted directly on a surface. As shown in FIG. 8, the curvature of the convex lens E is twice the curvature of concave lens A. It is, further, shown that at the transition between concave lens A and convex lens E the tangents on both lenses are identical. Additionally, the convex lens contacts the concave lens such that there is a smooth transition between the lenses. This type of transition eliminates the need for an additional lens which can have undesirable effects. The radius of curvature of the concave lens is more than twice that of the distance between chip C and that point of the concave lens A closest to chip C. The radius of curvature of the concave lens A is 2.5 times as large as this distance between chip C and the point of the concave lens A lying closest to chip C.

The external reflector R illustrated in FIGS. 2 and 7 has surfaces with two angles of aperture, specifically an inner angle 10 and an outer angle 20.

The optical emission device O can be driven using the same components used to drive a standard LED. Conventional driver components can be used to drive standard embodiments of an optical emission device O. With a low-current version of the optical emission device, LSTTL an CMOS logic outputs can be used to supply the requisite current to the optical emission device. These low-current versions can be operated at a maximum current of 7.5 mA (standard version: 45 mA) in the forward direction. With a forward current of this low-current version will typically emit a light flux of 2.5 mlm. The unit lumen (lm) indicates that in an optical emission device O, the entire light current is measured, while in standard LEDs the light intensity in the axial direction (unit candela) is measured and specified.

The structural height in the optical emission device O is at least one millimeter less than that of a comparable standard LED. The optimum radiation characteristic of the optical emission device O (FIG. 3) permits the creation illuminated areas while simultaneously maintaining a low structural height of the assembly. Assemblies consisting of an optical emission device O, an external reflector R and a diffusion screen S, can be structured so that the assembly has the same height as a standard 7-segment display. Hence, display units (panels) including 7-segment displays and optical emission devices can be constructed, such that these components of a display unit are mechanically and electrically compatiable.

With such optical emission devices O an area of up to 1 cm² can be illuminated homogeneously. Larger areas can also be homogeneously illuminated by laying out several optical emitter components O in a grid.

In many cases replacing light bulbs with optical emitter components O is readily possible. For optimum replacement it may become necessary to use an appropriately shaped reflector R as well as a diffusion screen S. The reflector R and diffusion screen S can be adapted for optimum application. The reflector R should consist of materials characterized by maximum diffuse reflection values (greater than 90%). By way of example, favorable results have been obtained using the thermoplastic polyester "Pocan B 7375 and 7376".

Optical emission devices O are suitable for almost any application for background lighting, since they do not set limits with respect to structural height or display area. Additionally, optical emission devices O are far superior to many conventional light sources currently used, specifically light bulbs. Optical emission devices O have a comparatively lower energy consumption, possess a longer life and are suited for automatic assembly. (For purposes of manufacturing, the optical emiter components O can be readily transferred from one assembly station to another station assembly using a continuous belt.)

Optical emission devices O are suitable for application in consumer electronics, such as the indicator panels of televisions and video equipment. Optical emission devices O are also suitable for applications in car radio sets as well as instruments and function indicators in automobiles. Optical emission devices O are, further, appropriate in MSR (process measuring and control technology) technology application, such as transmission technology. There, they provide backlighting for controlling units and automated manufacturing installations, where they indicate operational states of various units and, for reasons of operating safety, must be very reliable.

The advantages of optical emitter components O can also be utilized in large electrical equipment, since, due to the now practically maintenance-free display panels, they offer faster servicing of previously simple but time-consuming exchanges.

While two embodiments of an optical emission device and several modifications thereof have been shown and described in detail herein, various other changes and modifications can be made without departing from the scope of the present invention.

We claim:

1. An optical emission device for radiating light in a solid angle comprising:
    an emitter semiconductor chip positioned on an optical axis of the device;
    a cover having a light aperture which is composed of a concave lens for radiating light from the emitter semiconductor chip into a solid angle of maximum size, the concave lens intersecting the optical axis, the cover including a convex lens which is positioned around the concave lens, wherein the convex lens contacts the concave lens such that there is a smooth transition region between the lenses, the convex lens surrounding the border of the concave lens for uniformly distributing light into said solid angle of maximum size.

2. The optical emission device of claim 1 wherein the curvature of the concave lens is substantially two times as large as the curvature of the convex lens.

3. The optical emission device of claim 1 further comprising a planar chip carrier for the emitter semiconductor chip.

4. The optical emission device of claim 2 further comprising a planar chip carrier for the emitter semiconductor chip.

5. The optical emission device of claim 1 wherein the emitter semiconductor chip has lambertain characteristics.

6. The optical emission device of claim 1 further comprising an external reflector, the external reflector surrounding the cover for deflecting the radiation emerging under a large angle out of the cover.

7. The optical emission device of claim 3 further comprising an external reflector, the external reflector surrounding the cover for deflecting the radiation emerging under a large angle out of the cover.

8. The optical emission device of claim 6 further comprising a diffusion screen fixed to the reflector, the diffusion screen being fixed to the external reflector in that region where the radiation leaves the reflector to make the radiation of the optical emission device homogeneous.

9. The optical emission device of claim 7 further comprising a diffusion screen fixed to the reflector, the diffusion screen being fixed to the external reflector in that region where the radiation leaves the reflector to make the radiation of the optical emission device homogeneous.

10. The optical emission device of claim 1 constructed as a surface mounted device component.

11. The optical emission device of claim 6 constructed as a surface mounted device component.

12. The optical emission device of claim 8 constructed as a surface mounted device component.

* * * * *